United States Patent
Homma

(10) Patent No.: US 11,502,057 B2
(45) Date of Patent: Nov. 15, 2022

(54) SEMICONDUCTOR DEVICE AND MANUFACTURING METHOD THEREOF

(71) Applicant: KIOXIA CORPORATION, Tokyo (JP)

(72) Inventor: Soichi Homma, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 86 days.

(21) Appl. No.: 17/005,186

(22) Filed: Aug. 27, 2020

(65) Prior Publication Data
US 2021/0257332 A1 Aug. 19, 2021

(30) Foreign Application Priority Data
Feb. 17, 2020 (JP) .............................. JP2020-024557

(51) Int. Cl.
*H01L 23/00* (2006.01)
*H01L 21/56* (2006.01)
*H01L 25/18* (2006.01)

(52) U.S. Cl.
CPC ............ *H01L 24/92* (2013.01); *H01L 21/563* (2013.01); *H01L 24/11* (2013.01); *H01L 24/13* (2013.01); *H01L 24/16* (2013.01); *H01L 24/27* (2013.01); *H01L 24/32* (2013.01); *H01L 24/33* (2013.01); *H01L 24/48* (2013.01); *H01L 24/73* (2013.01); *H01L 24/81* (2013.01); *H01L 24/83* (2013.01); *H01L 25/18* (2013.01);
(Continued)

(58) Field of Classification Search
CPC ......... H01L 24/92; H01L 24/11; H01L 24/13; H01L 24/16; H01L 24/27; H01L 24/32; H01L 24/73; H01L 24/81; H01L 24/83; H01L 2224/1146; H01L 2224/11831; H01L 2224/11849; H01L 2224/11912; H01L 2224/92143; H01L 2224/13147; H01L 2224/13582; H01L 2224/13611; H01L 21/56; H01L 2224/13639; H01L 2224/13655; H01L 2224/1622; H01L 2224/27831; H01L 2224/32225; H01L 2224/73204; H01L 2224/81191; H01L 2224/83191; H01L 2224/8392; H01L 2224/83192
See application file for complete search history.

(56) References Cited

U.S. PATENT DOCUMENTS 6,201,301 B1 * 3/2001 Hoang .................. H01L 21/563
257/712
7,331,502 B2 2/2008 Okada et al.
(Continued)

FOREIGN PATENT DOCUMENTS

CN 102468245 A 5/2012
CN 109390326 A 2/2019

*Primary Examiner* — Jasmine J Clark
(74) *Attorney, Agent, or Firm* — Kim & Stewart LLP

(57) ABSTRACT

A semiconductor device includes a substrate having a plurality of pads on a surface of the substrate, a semiconductor chip that includes a plurality of metal bumps connected to corresponding pads on the substrate, a first resin layer between the surface of the substrate and the semiconductor chip, a second resin layer between the substrate and the semiconductor chip and between the first resin layer and at least one of the metal bumps, and a third resin layer on the substrate and above the semiconductor chip.

18 Claims, 12 Drawing Sheets

(52) U.S. Cl.
CPC ......... *H01L 2224/1146* (2013.01); *H01L 2224/11831* (2013.01); *H01L 2224/11849* (2013.01); *H01L 2224/11912* (2013.01); *H01L 2224/13147* (2013.01); *H01L 2224/13582* (2013.01); *H01L 2224/13611* (2013.01); *H01L 2224/13639* (2013.01); *H01L 2224/13655* (2013.01); *H01L 2224/16227* (2013.01); *H01L 2224/27831* (2013.01); *H01L 2224/32145* (2013.01); *H01L 2224/32225* (2013.01); *H01L 2224/33106* (2013.01); *H01L 2224/33181* (2013.01); *H01L 2224/48145* (2013.01); *H01L 2224/48225* (2013.01); *H01L 2224/73204* (2013.01); *H01L 2224/73215* (2013.01); *H01L 2224/73253* (2013.01); *H01L 2224/73265* (2013.01); *H01L 2224/81191* (2013.01); *H01L 2224/8392* (2013.01); *H01L 2224/83191* (2013.01); *H01L 2224/83192* (2013.01); *H01L 2224/92143* (2013.01)

(56) References Cited

U.S. PATENT DOCUMENTS

| | | |
|---|---|---|
| 8,710,654 B2 | 4/2014 | Tsukiyama et al. |
| 8,941,246 B2 | 1/2015 | Miura et al. |
| 9,570,414 B2 | 2/2017 | Tsukiyama et al. |
| 2012/0119372 A1 | 5/2012 | Yasukawa |

\* cited by examiner

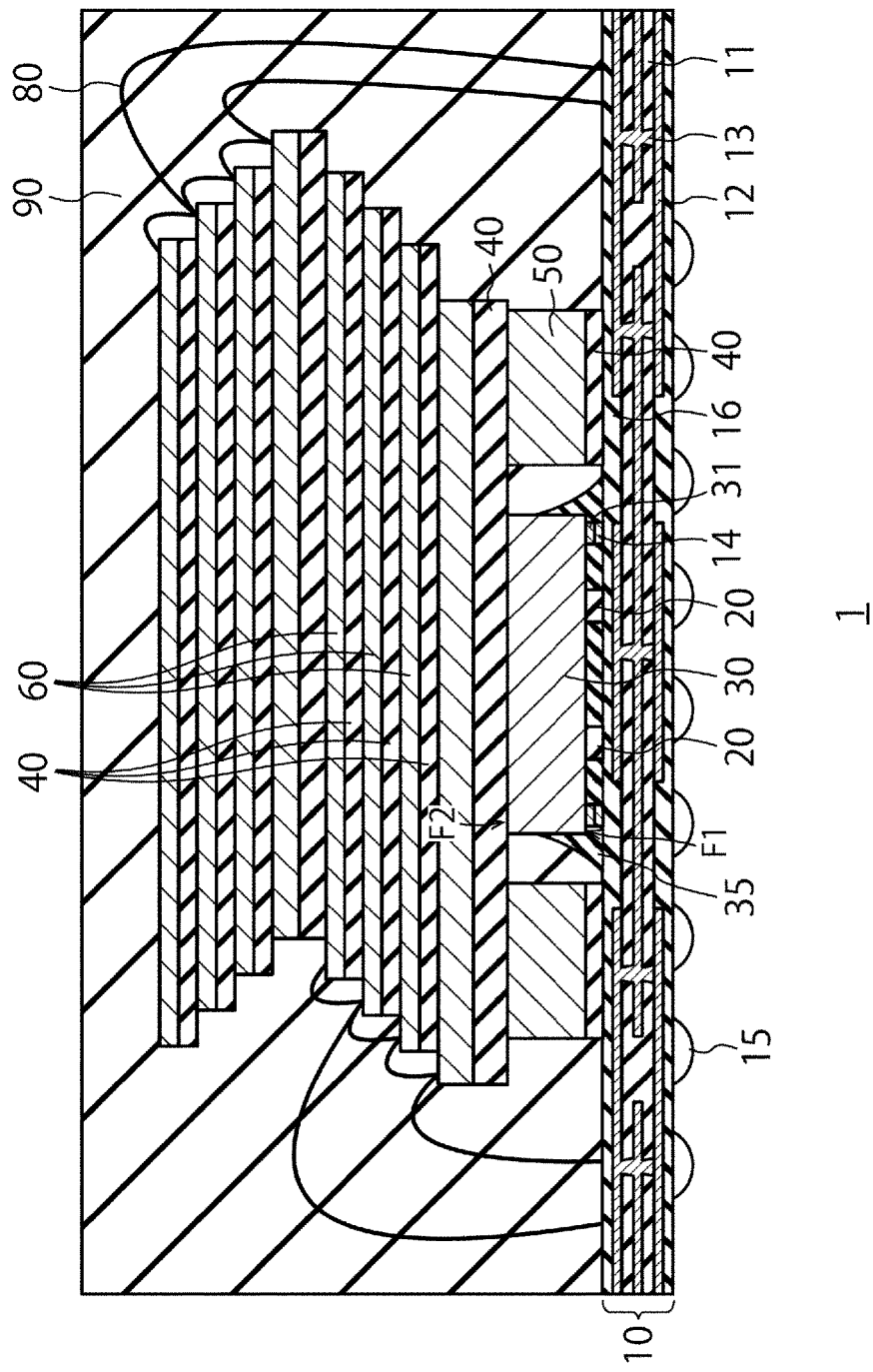

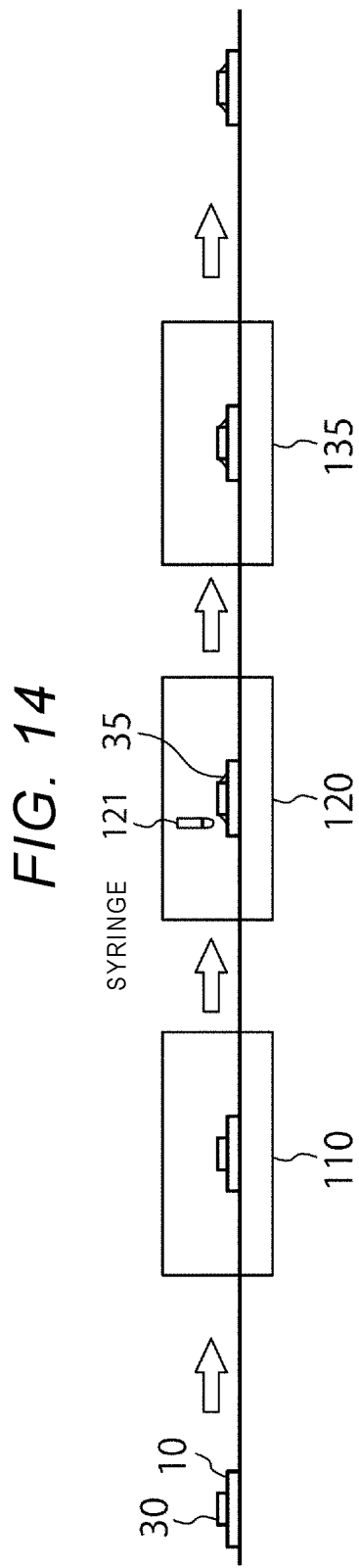

SEMICONDUCTOR DEVICE AND MANUFACTURING METHOD THEREOF

CROSS-REFERENCE TO RELATED APPLICATION(S)

This application is based upon and claims the benefit of priority from Japanese Patent Application No. 2020-024557, filed Feb. 17, 2020, the entire contents of which are incorporated herein by reference.

FIELD

Embodiments described herein relate generally to a semiconductor device and a manufacturing method thereof.

BACKGROUND

Flip-chip connection is widely used to connect a semiconductor chip to a terminal on a substrate via a metal bump. In recent years, semiconductor chips have been made thinner and thinner, so such thin chips may be warped in the manufacturing process. When such a warped semiconductor chip is flip-chip connected to the wiring substrate, the semiconductor chip may be broken in the process or causing a poor connection between the metal bump and the terminal of the wiring substrate.

When flip-chip connection and resin sealing are performed together, a filler inside the sealing resin or the sealing resin itself may enter between the bump on the semiconductor chip and the terminal on the wiring substrate, which can result in a failed or poor electrical connection between the bump and the terminal. When a low dielectric film (also referred to as a low-k film) is used in the semiconductor chip, stress may be applied and the low dielectric film may be peeled off.

BRIEF DESCRIPTION OF THE DRAWINGS

FIG. 1A is a cross-sectional view showing a semiconductor device according to a first embodiment.

FIG. 14 is a schematic diagram depicting aspects of a manufacturing method of a semiconductor device according to a fourth embodiment.

DETAILED DESCRIPTION

Figure 1B:
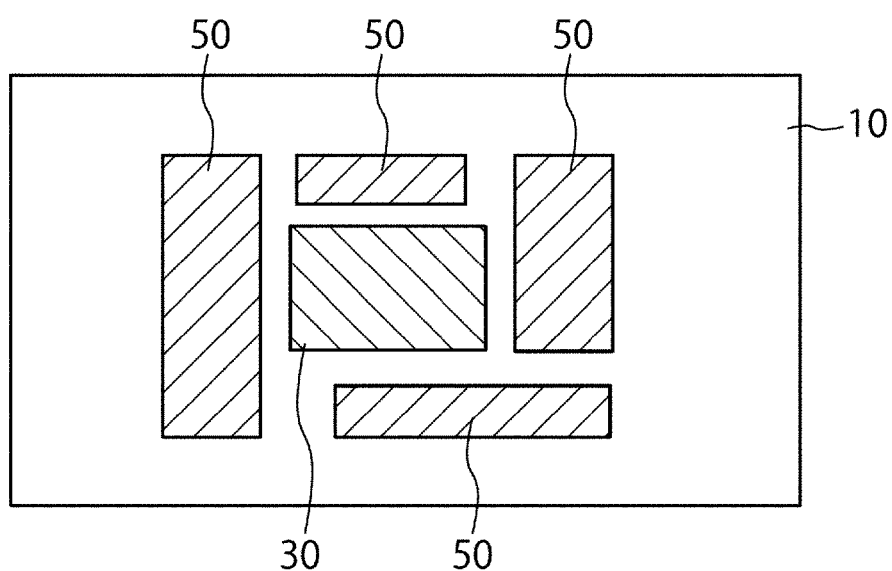
FIG. 1B is a plan view showing a semiconductor device according to a first embodiment.

Embodiments provide a semiconductor device in which a warped semiconductor chip and a wiring substrate can be well-connected when the semiconductor chip is mounted on the wiring substrate, and a manufacturing method of the semiconductor device.

In general, according to one embodiment, a semiconductor device includes a substrate having a plurality of pads on a surface of the substrate. The semiconductor device includes a semiconductor chip that includes a plurality of metal bumps connected to corresponding pads on the substrate. The semiconductor device includes a first resin layer between the surface of the substrate and the semiconductor chip. The semiconductor device includes a second resin layer between the substrate and the semiconductor chip and between the first resin layer and at least one of the metal bumps. The semiconductor device includes a third resin layer on the substrate and above the semiconductor chip.

Hereinafter, certain example embodiments will be described with reference to drawings. These example embodiments are not intended to limit the present disclosure. These drawings are schematic or conceptual. Depicted dimensional ratios or the like of parts, components, or aspects are not necessarily the same as actual ones. In the specification and the drawings, the same elements as those described in preceding drawings are denoted by the same reference numerals, and a detailed description thereof is omitted as appropriate.

In the following, references to a vertical direction and up/down directions or the likerefer to a relative direction from another component, generally the wiring substrate, for which, for example, movement or positioning closer to the (upper) surface of the wiring substrate on which the semiconductor chip is mounted is considered downward (or lower) and movement (or positioning) farther away from that upper surface is considered upward (or upper) movement (or positioning). The vertical, up/down direction may not be coincident with tha direction of gravitational force. The upper surface of the wiring substrate may also be referred to as a front surface. The backside surface (side opposite the upper surface) of the wiring substrate, may be also referred to as a back surface or a rear surface.

First Embodiment

FIG. 1A is a cross-sectional view showing a semiconductor device 1 according to a first embodiment. The semiconductor device 1 is, for example, a NAND flash memory. The semiconductor device 1 includes a wiring substrate 10, a first resin layer 20, a controller chip 30 (hereinafter sometimes referred to as the first semiconductor chip), a second resin layer 35, a third resin layer 90, fourth resin layers 40, spacers 50, NAND memory chips (hereinafter referred to as the memory chips or the second semiconductor chips) 60, and a bonding wire 80. The third resin layer 90 is a mold resin and is a sealing resin. The semiconductor device 1 is not limited to a NAND flash memory, and may be applied to any semiconductor device for which flip-chip connection is used.

The wiring substrate 10 includes an insulating substrate 11, wires 12, contact plugs 13, metal pads 14, solder balls 15, and solder resist 16. The insulating substrate 11 includes an insulation material, such as a glass epoxy resin and a ceramic (e.g., an alumina type or an AlN type). The wires 12 can be provided on a front surface, a back surface, or inside the insulating substrate 11. The wires 12 electrically connect the metal pads 14 and the solder balls 15. The contact plugs 13 pass through the insulating substrate 11 and electrically connect the wires 12. The metal pads 14 are connected with metal bumps of the controller chip 30 on a front surface of the wiring substrate 10. The solder balls 15 are connected to the wires 12 on a back surface of the wiring substrate 10. The wires 12, the contact plugs 13, and the metal pads 14 are formed of a conductive material, such as a single film, a composite film, and an alloy film including a metallic element such as copper (Cu), nickel (Ni), gold (Au), tin (Sn), silver (Ag), bismuth (Bi), and/or palladium (Pd). The solder balls 15 are formed of a conductive material, such as a single film, a compsite film, and an alloy film including tin (Sn), gold (Ag), copper (Cu), gold (Au), bismuth (Bi), zinc (Zn), indium (In), antimony (Sb), and/or nickel (Ni). Solder resist 16 is provided on the upper surface and the back surface of the wiring substrate 10. The solder reist is between adjacent metal pads 14 and between adjacent solder balls 15. The solder resist 16 electrically insulates the metal pads 14 and the solder balls 15. Solder resist 16 covers upper surfaces of the wires 12 to protect the wires 12.

The controller chip 30 has a first surface F1 facing the wiring substrate 10 and a second surface F2 at an opposite side to the first surface F1. The metal bumps 31 are provided on the first surface F1. The metal bumps 31 are connected (or welded or otherwise joined) to the metal pads 14 of the wiring substrate 10. That is, the controller chip 30 is flip-chip connected to the wiring substrate 10. An example of the metal bumps 31 includes a conductive metal such as solder. A substrate of the semiconductor chip may be a silicon substrate, a GaAg substrate, a SiC substrate, or the like.

The controller chip 30 is thinned and includes a semiconductor element on the first surface F1 or the second surface F2. The controller chip 30 may be warped when the semiconductor element is formed. The controller chip 30 may be warped into a mountain shape, a bowl shape, a saddle shape, or the like. Warpage of the controller chip 30 is not shown in FIG. 1A.

The first resin layer 20 is provided between the wiring substrate 10 and the first surface F1 of the controller chip 30. The first resin layer 20 has a columnar shape and bonds the wiring substrate 10 and the controller chip 30.

The first resin layer 20 is formed of a resin, such as a phenol-based resin, a polyimide-based resin, a polyamide-based resin, an acryl-based resin, an epoxy-based resin, a PBO-based resin, a silicone-based resin, and a benzocyclobutene-based resin, or a mixed or composite material of the resins.

The second resin layer 35 is embedded between the wiring substrate 10 and the first surface F1 of the controller chip 30. The second resin layer 35 is, for example, an underfill that is a liquid non-conductive resin material. The second resin layer 35 covers peripheries of the first resin layer 20, the metal pads 14, and the metal bumps 31. Accordingly, the first resin layer 20 and the second resin layer 35 support a connection between the metal pads 14 and the metal bumps 31, and prevent breakage between the metal pads 14 and the metal bumps 31. The second resin layer 35 can protect the first resin layer 20 between the wiring substrate 10 and the controller chip 30. Since the controller chip 30 and the wiring substrate 10 are bonded by the first resin layer 20, and the second resin layer 35 protects the first resin layer 20, warpage of the controller chip 30 is reduced.

A base material of the second resin layer 35 may be an epoxy resin, a silicone resin, an epoxy and silicone mixed resin, an acrylic resin, a polyimide resin, a polyamide resin, a phenol resin, and the like.

In order to remove a metal oxide film formed on front surfaces of the metal bumps 31, the second resin layer 35 contains a reducing material such as an alcohol or an organic acid as an additive material. Examples of the alcohol include at least one of methanol, ethanol, isopropyl alcohol, polyvinyl alcohol, ethylene glycol, propylene glycol, diethylene glycol, glycerin, triethylene glycol, tetraethylene glycol, carbitol, cellosolve alcohol, and the like. The second resin layer 35 may include an alkyl ether material. Examples of the alkyl ether material include diethylene glycol monobutyl ether and triethylene glycol dimethyl ether. The second resin layer 35 may include alkane, an amine compound, and the like. Examples of the alkane and the amine compound include formamide and dimethylformamide. The materials described above may be used alone, or a plurality of the materials described above may be mixed. An organic acid may be added to the materials described above. Examples of the organic acid include formic acid, an acetic acid, benzoic acid, abietic acid, parastophosphoric acid, dehydroabietic acid, isopimaric acid, neoabietic acid, pimaric acid, and rosin. The acids may be used alone, or a plurality of the acids may be mixed. The second resin layer 35 is coated by a method such as a dispensing method (e.g., a jet method and a screw method) and a printing method. The second resin layer 35 has a function of reducing and removing oxide films (SnO, $SnO_2$) and the like on the front surfaces of the metal bumps 31 or the metal pads 14.

The spacers 50 are provided on the wiring substrate 10 around the controller chip 30 via the fourth resin layers 40. Each of the fourth resin layers 40 is, for example, a die attach film (DAF). The spacers 50 are bonded onto the wiring substrate 10 by the fourth resin layers 40. A height of upper surfaces of the spacers 50 from the wiring substrate 10 is substantially equal to a height of the second surface F2 of the controller chip 30.

FIG. 1B is a plan view showing the semiconductor device 1. As shown in FIG. 1B, the spacers 50 have, for example, a square frame shape or a square shape surrounding the controller chip 30, and support the memory chips 60. The spacers 50 surround four sides of the controller chip 30 on the front surface of the wiring substrate 10. The spacers 50 include a material, such as silicon, glass, and ceramic, an insulating substrate, and a metal plate. In order to improve adhesion of the spacers 50, an organic film, such as a polyimide resin, a polyamide resin, an epoxy resin, an acrylic resin, a phenolic resin, a silicone resin, and a poly benz oxazole (PBO) resin may be formed on the spacers 50.

The memory chips 60 are provided above the controller chip 30, and is fixed to the controller chip 30 and the spacers 50 by the fourth resin layer 40. The memory chips include, for example, a three-dimensional memory cell array in which a plurality of memory cells are arranged three-dimensionally. The fourth resin layers 40 are provided on the second surface F2 of the controller chip 30 and the spacers 50, and fix the memory chips 60 on the controller chip 30 and the spacers 50.

A plurality of fourth resin layers 40 and a plurality of memory chips 60 may be alternately stacked on the controller chip 30 and the spacers 50. Since the warpage of the controller chip 30 is reduced even when the plurality of memory chips 60 are stacked above the controller chip 30 in this manner, the plurality of memory chips 60 are less likely to be affected by the warpage of the controller chip 30. That is, the plurality of memory chips 60 are less likely to be broken and detached from the fourth resin layers 40.

The bonding wire 80 electrically connects metal pads of the memory chips 60 and one of the metal pads 14 of the wiring substrate 10. The third resin layer 90 covers and protects an entire structure on the wiring substrate 10 including the controller chip 30, the memory chips 60, the bonding wire 80, and the like. The third resin layer 90 is filled between the wiring substrate 10 and the first surface F1 of the controller chip 30, and covers peripheries of the first resin layer 20 and the metal bumps 31.

Here, the first resin layer 20 and the second resin layer 35 will be described in detail.

Figure 2A:
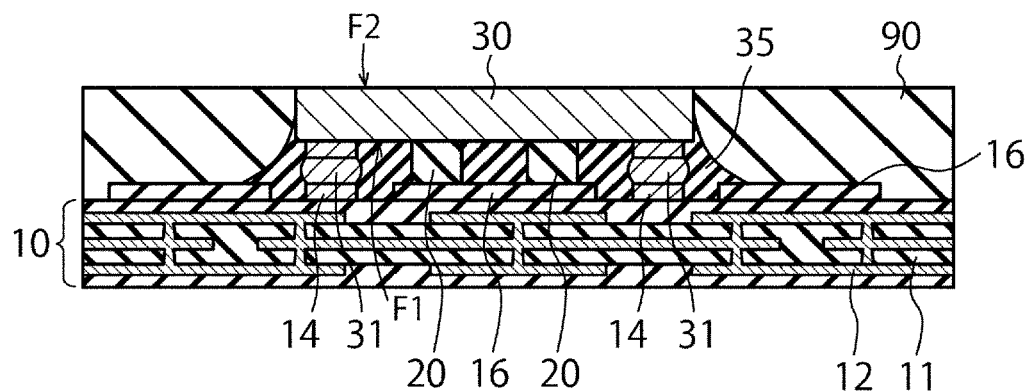
FIG. 2A and FIG. 2B are cross-sectional views showing a first resin layer and a second resin layer.
Figure 2B:
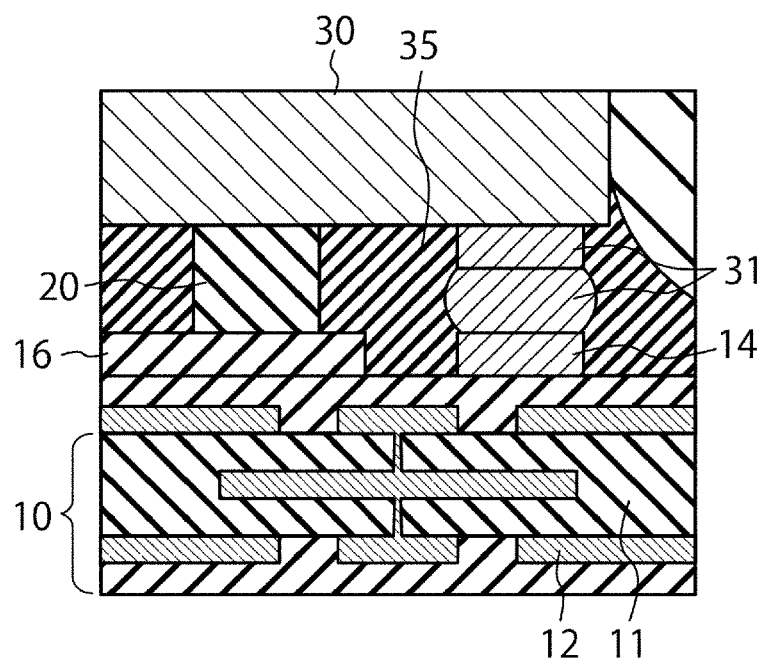

FIGS. 2A and 2B are cross-sectional views showing the first resin layer 20, the second resin layer 35, and peripheries of the first resin layer 20 and the second resin layer 35. is provided between the first surface F1 of the controller chip 30 and the solder resist 16 of the wiring substrate 10. The first resin layer 20 bonds the controller chip 30 and the wiring substrate 10. The thermal expansion coefficient of the first resin layer 20 is larger than the thermal expansion coefficients of the wiring substrate 10 (for example, a glass epoxy resin), the controller chip 30 (for example, silicon), and the third resin layer 90. Since the thermal expansion coefficient of the controller chip 30 (for example, silicon) is smaller than the thermal expansion coefficient of the wiring substrate 10 (for example, a glass epoxy resin), the wiring substrate 10 expands and contracts more than the controller chip 30 with temperature changes when the controller chip 30 is mounted on the wiring substrate 10. For example, a thermal expansion coefficient of a single-crystal silicon is about 3.5 ppm/° C., and a thermal expansion coefficient of a glass epoxy resin is about 17 ppm/° C. When the thermal expansion coefficient of the first resin layer 20 is smaller than the thermal expansion coefficients of the wiring substrate 10 and the controller chip 30, the first resin layer 20 cannot match expansion and contraction differences between the wiring substrate 10 and the controller chip 30 and thus may be peeled off when the controller chip 30 is mounted on the wiring substrate 10. Therefore, the thermal expansion coefficient of the first resin layer 20 is preferably in a range of 20 ppm/° C. to 100 ppm/° C. The thermal expansion coefficient of the first resin layer 20 is more preferably in a range of 30 ppm/° C. to 60 ppm/° C. When the thermal expansion coefficient of the first resin layer 20 is smaller than 20 ppm/° C., the thermal expansion coefficient of the first resin layer 20 is close to the thermal expansion coefficient of the wiring substrate 10. The first resin layer 20 cannot match expansion and contraction differences between the wiring substrate 10 and the controller chip 30, and may be peeled off. On the other hand, when the thermal expansion coefficient of the first resin layer 20 is larger than 100 ppm/° C., the first resin layer 20 may expand too much and the controller chip 30 may be peeled off from the wiring substrate 10. In the cases described above, the metal bumps 31 are broken or peeled off from the metal pads 14, which causes a poor (or failed) connection. Therefore, the thermal expansion coefficient of the first resin layer 20 is preferably larger than the wiring substrate 10 (for example, a glass epoxy resin) and the thermal expansion coefficient of the controller chip 30 (for example, silicon). Further, the thermal expansion coefficient of the first resin layer 20 is preferably larger than the thermal expansion coefficient of the third resin layer 90 so that warpage can be prevented.

The first resin layer 20 has an elastic modulus that is smaller than an elastic modulus of the solder resist 16 and an elastic modulus of the metal bump 31 (for example, solder). When the elastic modulus of the first resin layer 20 is larger than the elastic modulus of the solder resist 16 and the elastic modulus of the metal bumps 31, the first resin layer 20 is harder and thus may be peeled off without reducing the warpage of the controller chip 30 with respect to the wiring substrate 10. Therefore, the elastic modulus of the first resin layer 20 is preferably in a range of 1 MPa to 3 GPa. The elastic modulus of the first resin layer 20 is more preferably in a range of 10 MPa to 1 GPa. When the elastic modulus of the first resin layer 20 is smaller than 1 MPa, the first resin layer 20 is generally too soft and it will be difficult to fix the controller chip 30 to the wiring substrate 10. When the elastic modulus of the first resin layer 20 exceeds 3 GPa, the first resin layer 20 is generally too hard and may be peeled off from the controller chip 30 or the wiring substrate 10 due to the warpage of the controller chip 30. In the cases described above, the metal bumps 31 are broken or peeled off from the metal pads 14, which causes a poor (or failed) connection. Therefore, the elastic modulus of the first resin layer 20 is preferably smaller than the elastic modulus of the solder resist 16 (serving as an insulating layer) and the elastic modulus of the metal bumps 31. The elastic modulus of the first resin layer 20 is more preferably smaller than the elastic modulus of the third resin layer 90 so that warpage can be prevented.

Next, the second resin layer 35 will be described in detail.

The second resin layer 35 is provided between the first surface F1 of the controller chip 30 and the solder resist 16 of the wiring substrate 10, and covers and protects the first resin layer 20, the metal pads 14, and the metal bumps 31. The second resin layer 35 contains a filler having a relatively small linear expansion coefficient such as silicon oxide (silica). The first resin layer 20 does not include a filler in the present embodiment. Alternatively, in other examples, the first resin layer 20 may include a filler. The concentration of the filler contained in the second resin layer 35 is higher than the concentration of the filler contained in the first resin layer 20. Therefore, the thermal expansion coefficient of the second resin layer 35 is smaller than the thermal expansion coefficient of the first resin layer 20. After the metal bumps 31 are reflowed, the elastic modulus of the second resin layer 35 is larger than the elastic modulus of the first resin layer 20.

The thermal expansion coefficient of the second resin layer 35 is reduced on a relative basis by increasing the concentration of the filler. Accordingly, the second resin layer 35 can prevent or limit a thermal expansion difference between the controller chip 30 and the wiring substrate 10 and can prevent differetnial expansion or contraction of one of the controller chip 30 and the wiring substrate 10.

The elastic modulus of the second resin layer 35 is larger than the elastic modulus of the first resin layer 20, so that protection performance for the metal bump 31 and the first resin layer 20 can be improved. Accordingly, thereafter, even when the metal bumps are reflowed, breakage of the metal bump 31 or the first resin layer 20 due to a stress can be prevented.

For example, a temperature cycle test was performed on the semiconductor device 1, and reliability of the semiconductor device 1 was examined. In the temperature cycle test, the semiconductor device 1 was subjected to a cycle in which the semiconductor device 1 was exposed to an atmosphere of −55° C. for 30 minutes, an atmosphere of 25° C. for 5 minutes, and ex an atmosphere of 125° C. for 30 minutes, and 3000 total cycles were performed. In the semiconductor device 1, breakage did not occur at connection portions between the metal bumps 31 and the metal pads 14. Therefore, in the semiconductor device 1, the connection portions between the metal bumps 31 and the metal pads 14 can be considered well protected by the first resin layer 20 and the second resin layer 35.

Even when the controller chip 30 is warped, the first resin layer 20 bonds the controller chip 30 to the wiring substrate 10, and the second resin layer 35 protects peripheries of the first resin layer 20 and the metal bump 31. Therefore, the controller chip 30 is prevented from being peeled off from the wiring substrate 10. The first resin layer 20 and the second resin layer 35 can correct the warpage of the controller chip 30 to some extent. Therefore, the metal bumps 31 and the metal pads 14 can be connected between the controller chip 30 and the wiring substrate 10, and the metal bumps 31 are less likely to be broken. As a result, a bad connection between the metal bumps 31 and the metal pads 14 can be prevented. In addition, since the warpage of the controller chip 30 is reduced, the memory chips 60 stacked on the controller chip 30 can be prevented from being broken. As a result, even when the warped controller chip 30 or memory chips 60 are mounted on the wiring substrate, the semiconductor chip and the wiring substrate can be well connected.

In FIG. 1A, both the controller chip 30 connected by flip-chip connection and the memory chips 60 connected by wire bonding are provided in the same semiconductor package. That is, FIG. 1A shows a multi-chip package of a hybrid type. Alternatively, a plurality of memory chips 60 may be connected in the same manner (i.e., by the flip-chip connection) as the controller chip 30. In such a case, the controller chip 30 and the plurality of memory chips 60 may be electrically connected via a through electrode (e.g., through silicon via (TSV)). Although the third resin layer 90 is not provided on the controller chip 30 in FIGS. 2A and 2B, the third resin layer 90 may be present on the controller chip 30, for example, when another chip is not mounted on an upper portion of the controller chip.

Next, a manufacturing method of the semiconductor device 1 will be described.

Figure 3A:
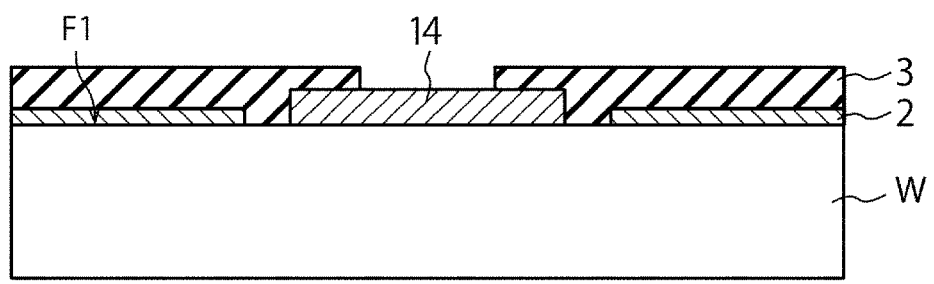
FIG. 3A and FIG. 3B are cross-sectional views depicting aspects of a manufacturing method of a controller chip according to a first embodiment.

FIGS. 3A to 9 are cross-sectional views showing the manufacturing method of the controller chip 30. First, as shown in FIG. 3A, a semiconductor element 2 and the metal pad 14 are formed on a semiconductor wafer W. The semiconductor wafer W is a silicon semiconductor wafer, a GaAs semiconductor wafer, a SiC semiconductor wafer, or the like. The semiconductor element 2 may be, for example, a complementary metal oxide semiconductor (CMOS) circuit. The metal pad 14 is formed of, for example, a single film, a composite film, or an alloy film including Al, Cu, Au, Ni, Pd, and/or Ag.

Next, a protective insulating film 3 is formed to cover the semiconductor element 2. The protective insulating film 3 is processed using a lithography technique and an etching technique so that a part of the metal pad 14 is exposed. The protective insulating film 3 is made of an insulating material such as a silicon oxide film, a silicon nitride film, a polyimide resin, a phenol resin, and a poly benz oxazole (PBO) resin. Alternatively, the protective insulating film 3 may be a composite film of such insulating materials.

Figure 3B:
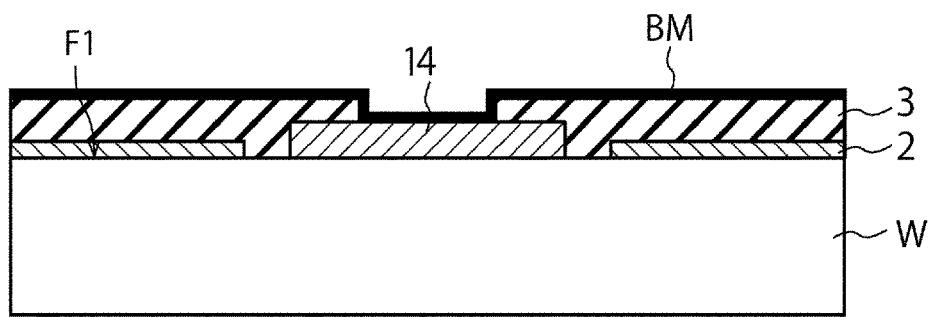

Next, as shown in FIG. 3B, a barrier metal BM is formed on the protective insulating film 3 and the metal pad 14 by using a sputtering method, a vapor deposition method, a chemical vapor deposition (CVD) method, an electroless plating method, or the like. The barrier metal BM is formed of, for example, a single film, a nitride film, a composite film, or an alloy film of a conductive metal(s) such as Ti, TiN, Cr, CrN, Cu, Ni, Au, Pd, and/or W. For example, a Ti film and a Cu film are formed by the sputtering method in order. For example, a thickness of the Ti film is about 0.1 μm and a thickness of the Cu film is about 0.3 μm.

Figure 4A:
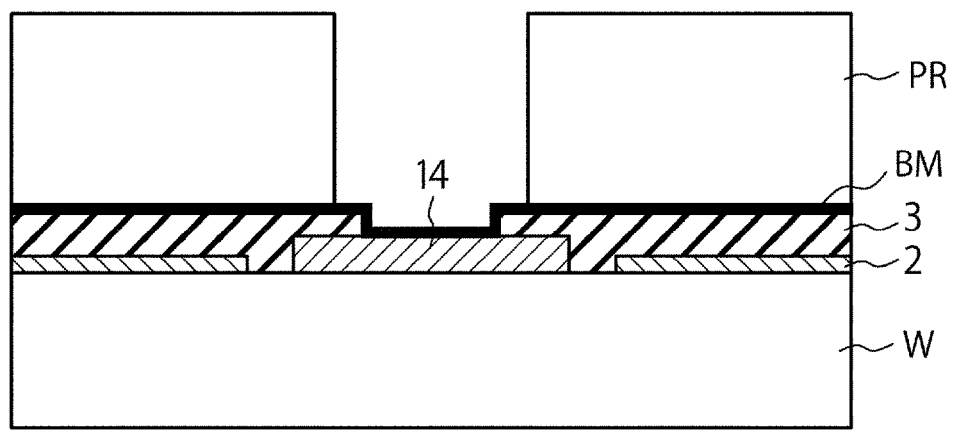
FIG. 4A and FIG. 4B are cross-sectional views depicting aspects of a manufacturing method of a controller chip according to a first embodiment.

Next, as shown in FIG. 4A, a resist PR is formed on the barrier metal BM by using the lithography technique. The resist PR is patterned so as to form an opening in a region of the metal pad 14. A thickness of the resist PR is, for example, about 40 μm. A size of the opening is, for example, about 20 μm. A pitch of the opening of the resist PR is about 50 μm. In order to remove residues in the opening of the resist PR, an asher processing using oxygen or the like may be performed after the resist PR is opened.

Figure 4B:
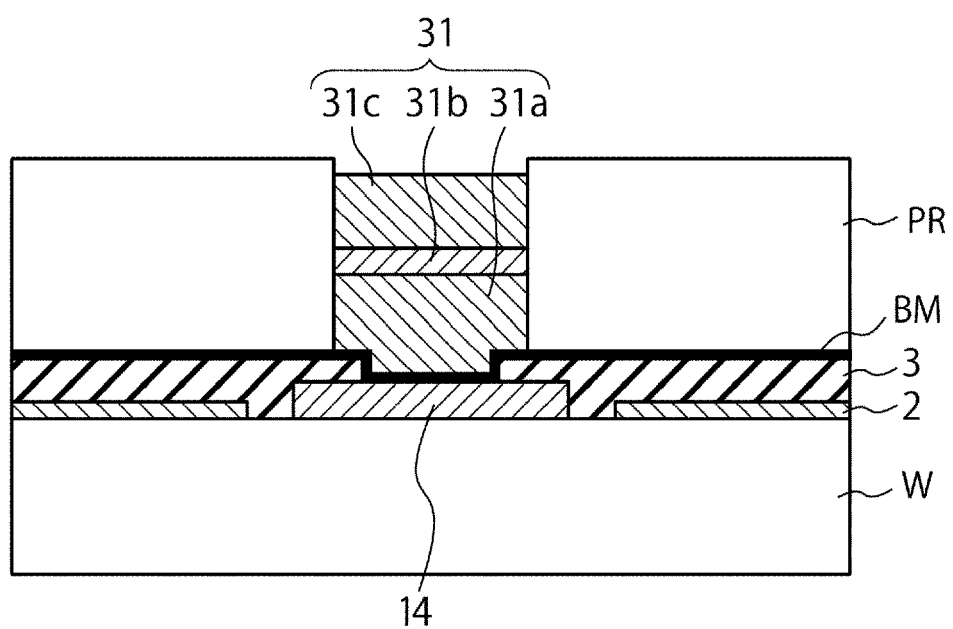

Next, as shown in FIG. 4B, metal plating is performed on the barrier metal BM on the metal pad 14. For example, metals 31a, 31b, and 31c are formed on the barrier metal BM. The metal 31a is, for example, copper. The metal 31b is, for example, nickel. The metal 31c is, for example, solder (SnAg). The metals 31a to 31c make up the metal bump 31. The solder is made of, for example, a single film, a composite film, or an alloy film of Sn, Ag, Cu, Au, Bi, Zn, In, Sb, Ni, or the like. The metal 31c may be formed by a printing method and a ball mounting method. The metal 31a is, for example, copper having a thickness of about 20 μm. The metal 31b is, for example, nickel having a thickness of about 3 μm. The metal 31c is, for example, SnAg having a thickness of about 12 μm.

Figure 5A:
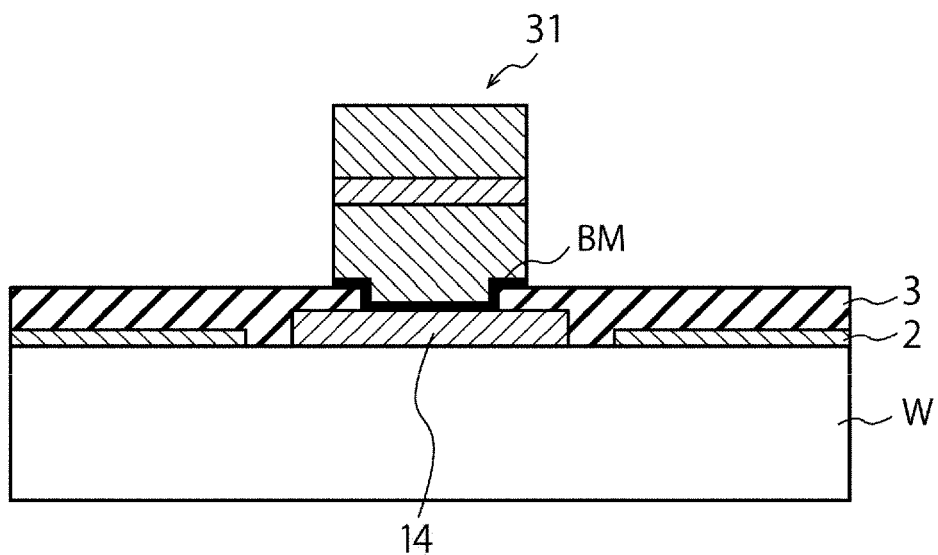
FIG. 5A and FIG. 5B are cross-sectional views depicting aspects of a manufacturing method of a controller chip according to a first embodiment.

Next, after the resist PR is removed by using an asher processing using oxygen or the like, as shown in FIG. 5A, the barrier metal BM is etched using the metal bump 31 as a mask. Accordingly, only the barrier metal BM under the metal bump 31 is left. For example, when copper is etched, a mixed solution of a citric acid and hydrogen peroxide may be used. When titanium is etched, a hydrofluoric acid, a hydrogen peroxide solution, or the like may be used.

Figure 5B:
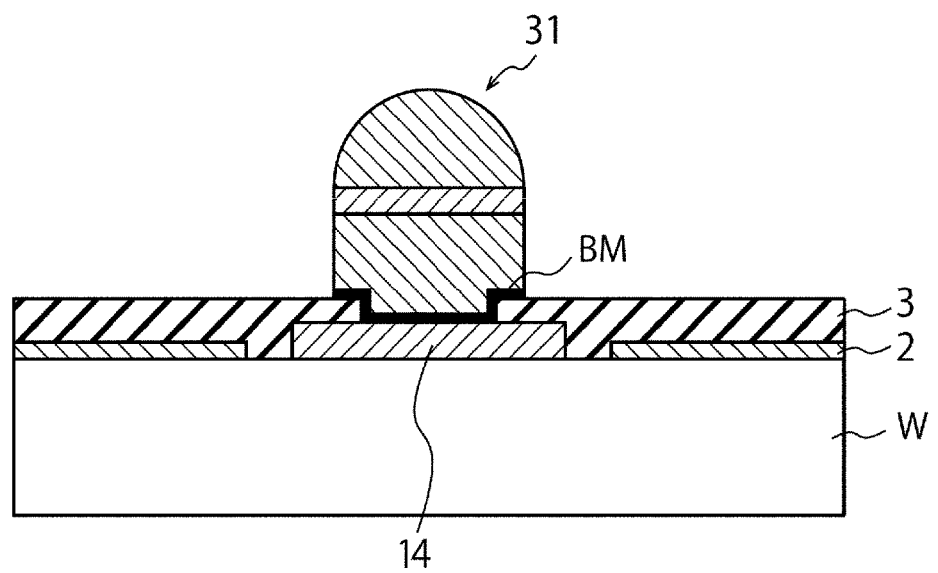

Next, as shown in FIG. 5B, the metal 31c (for example, solder) of the metal bump 31 is reflowed (or melted) by a heat processing to round a tip end of the metal bump 31. In a reflow processing, the metal 31c may be reflowed in an $N_2$ atmosphere by applying a flux, or may be reflowed while reducing a soler oxide film in a reducing atmosphere such as formic acid gas, $H_2$ gas, and a mixed gas of $H_2$ and $N_2$. The reflow processing may be performed by removing the solder oxide film by Ar plasma or the like. For example, the reflow processing is performed in the $N_2$ atmosphere under 260° C. for 30 seconds after a water-soluble flux is coated. When a flux is used, cleaning is performed after the reflow processing in order to remove the flux. When a water-soluble flux is used, pure water or the like is used to clean out the flux. When a rosin-based flux is used, an alcohol-based solvent or the like is used to clean out the flux.

Figure 6A:
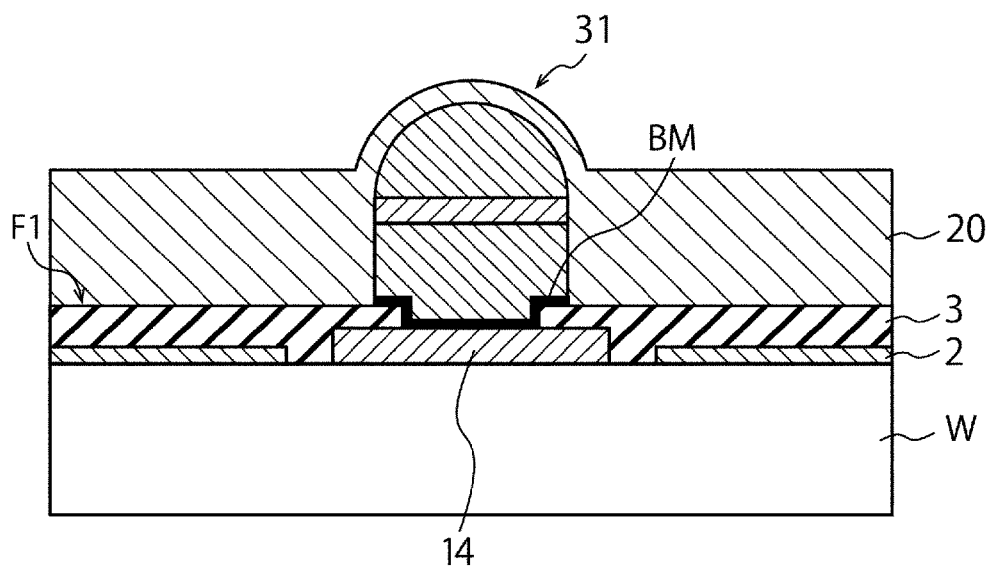
FIG. 6A and FIG. 6B are cross-sectional views depicting aspects of a manufacturing method of a controller chip according to a first embodiment.
Figure 6B:
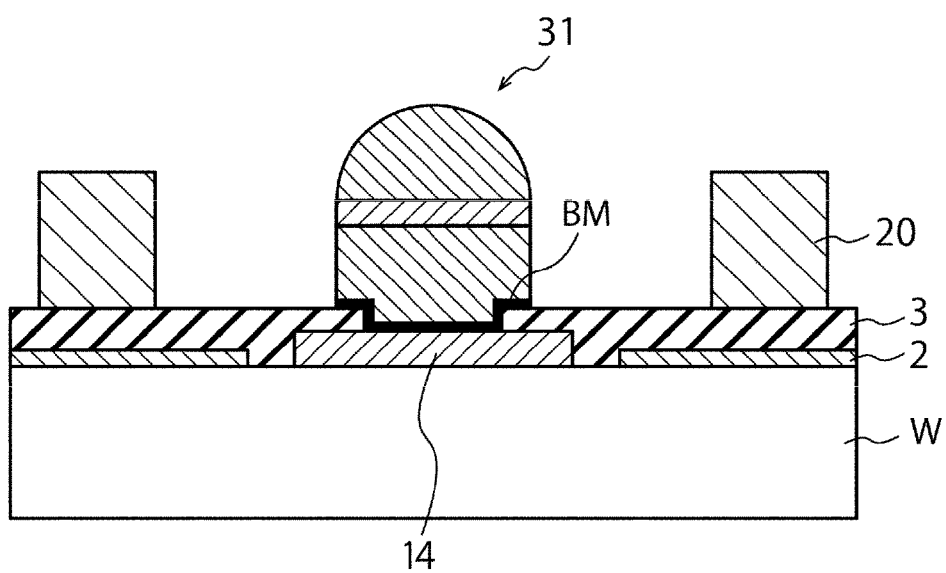

Next, as shown in FIG. 6A, a material of the first resin layer 20 is coated on the metal bump 31 and the protective insulating film 3 on the first surface F1. Here, the first resin layer is adjusted so as to have photosensitivity. The material of the first resin layer 20 is coated with a film having a thickness less than that of the metal bump 31 (for example, about 30 μm). Since the first resin layer 20 is a photosensitive material, as shown in FIG. 6B, the first resin layer 20 can be patterned by using a lithography technique. Accordingly, the first resin layer 20 is selectively left in a columnar shape at a predetermined position on the protective insulating film 3. Although the photosensitive first resin layer 20 is coated onto the controller chip 30 in the process described above, the photosensitive first resin layer 20 may be formed on the wiring substrate 10, or may be formed on both the controller chip 30 and the wiring substrate 10.

Figure 7A:
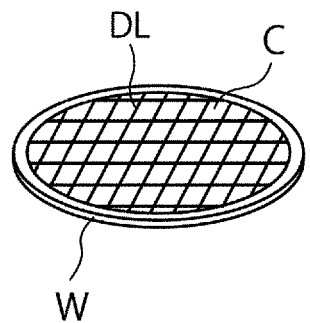
FIG. 7A, FIG. 7B, and FIG. 7C are cross-sectional views depicting aspects of a manufacturing method of a controller chip according to a first embodiment.

FIG. 7A shows the semiconductor wafer W after the semiconductor element is formed. Next, a backside surface of the semiconductor wafer is polished and the wafer is thinned. Dicing lines DL are provided between a plurality of controller chips 30, and the controller chips 30 are separated into individual pieces by being cut along the dicing lines DL, which will be described later.

Figure 7B:
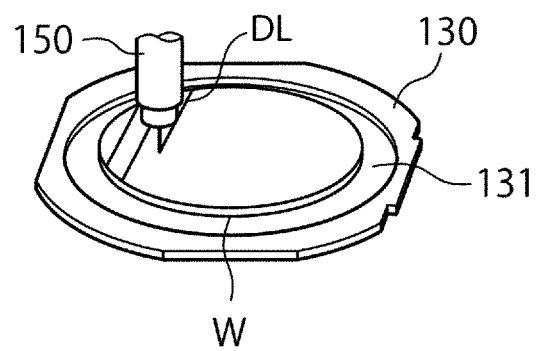

Next, as shown in FIG. 7B, the semiconductor wafer W is attached to a flexible resin tape 131 stretched in a wafer ring 130. Next, portions corresponding to the dicing lines DL are irradiated with laser light from a front surface of the semiconductor wafer W by using a laser oscillator 150. In this manner, grooves are formed along the dicing lines DL on the semiconductor wafer W.

Figure 7C:
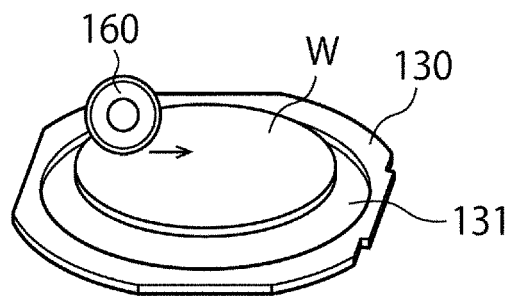

Next, as shown in FIG. 7C, the semiconductor wafer W is cut along the dicing lines DL using a dicing blade 160. Accordingly, the semiconductor wafer W is separated into individual pieces of the controller chips 30 on the resin tape 131. The semiconductor wafer W may be separated into individual pieces only by blade dicing without irradiation with the laser light.

Next, the resin tape 131 is irradiated with ultraviolet rays to reduce tackiness of an adhesive between the controller chip 30 and the resin tape 131, and the controller chip 30 can be detached from the resin tape 131. Appearance inspection or the like is performed. The controller chip 30 is manufactured in this manner. In the memory chips 60, for example, a memory cell array may be formed on the semiconductor wafer W as the semiconductor element 2. Since other manufacturing steps of the memory chips 60 are the same as manufacturing steps of the controller chip 30, a description thereof will be omitted.

Next, a method for mounting the controller chip 30 on the wiring substrate 10 will be described. The solder resist 16 is formed on the wiring substrate 10. The solder resist 16 is formed of a resin, such as an epoxy-based resin, a phenol-based resin, a polyimide-based resin, a polyamide-based resin, an acryl-based resin, a PBO-based resin, and a silicone-based resin, or a mixed or composite material of the resins. Further, a filler such as silica may be contained in the solder resist 16.

Figure 8:
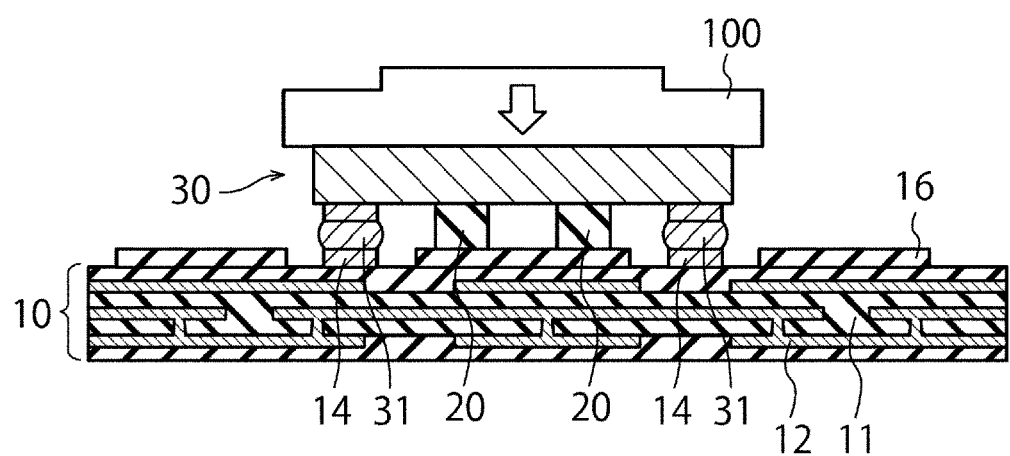
FIG. 8 is a cross-sectional view depicting aspects of a manufacturing method of a controller chip according to a first embodiment.
Figure 9:
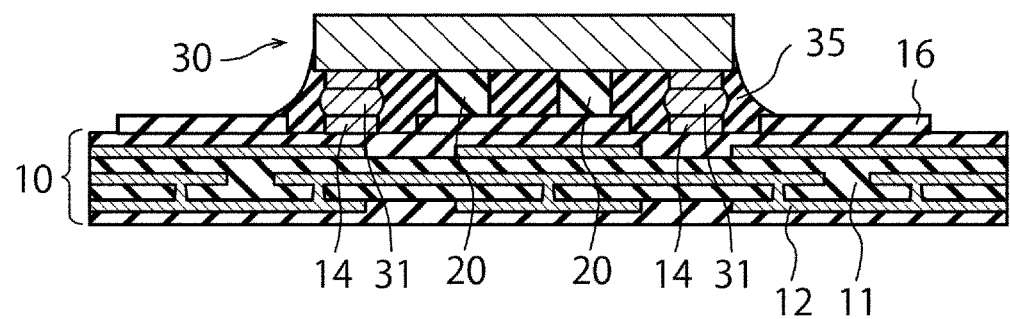
FIG. 9 is a cross-sectional view depicting aspects of a manufacturing method of a controller chip according to a first embodiment.

FIGS. 8 and 9 are cross-sectional views showing an assembly step of the controller chip 30 on the wiring substrate 10. First, the wiring substrate 10 may be baked to remove moisture. Alternatively, a plasma processing may be performed to improve adhesion between the wiring substrate 10 and the first resin layer 20.

Next, as shown in FIG. 8, the controller chip 30 is picked up by a crimping device 100, and the controller chip 30 is aligned with the wiring substrate 10 according to an alignment mark of the wiring substrate 10. Next, the crimping device 100 thermally crimps the controller chip 30 onto the wiring substrate 10, and connects the metal bump 31 of the controller chip 30 and the metal pad 14 of the wiring substrate 10 by flip-chip connection. For example, a temperature of the stage on which the wiring substrate 10 is mounted is heated to about 100° C., and a temperature of the head holding the controller chip 30 is heated to about 200° C. Accordingly, a temperature of the first resin layer 20 is about 150° C., the first resin layer 20 is softened, and the controller chip 30 and the wiring substrate 10 are bonded by the first resin layer 20. A gap of about 1 μm or less may be formed between the metal bump 31 and the metal pad 14. A heating method of the crimping device 100 may be constant heating or pulse heating.

Next, the second resin layer 35 is supplied between the wiring substrate 10 and the controller chip 30. The second resin layer 35 may be supplied by a dispensing method (e.g., a jet method and a screw method), a printing method, or the like. As described above, a resin serving as a base material of the second resin layer 35 is a liquid material or a paste material into which a reducing material for removing a metal oxide film is added. The second resin layer 35 is introduced between the wiring substrate 10 and the controller chip 30 by a capillary phenomenon. The second resin layer 35 is filled around the metal bumps 31 and the metal pads 14, and metal oxide films (natural oxide films) formed on the metal bumps 31 and the metal pads 14 are removed. Accordingly, the metal bumps 31 and the metal pads 14 are well connected. The second resin layer 35 is also filled around the first resin layer 20. At the same time, the second resin layer 35 extends along a side wall of the controller chip 30 to cover up to an intermediate portion of the controller chip 30.

Next, the controller chip 30 and the wiring substrate 10 are placed in a reflow furnace (not shown) and heated. The controller chip 30 and the wiring substrate 10 may be reflowed using a laser. The metal bumps 31 are melted by raising a temperature of the metal bumps 31 to a temperature equal to or higher than a melting point of the metal bumps 31. The metal bumps 31 are reflowed in this manner, so that the metal bumps 31 and the metal pads 14 are reliably connected. Here, a viscosity of the second resin layer 35 during the reflow of the metal bumps 31 is 100 Pa·s to 30,000 Pa·s. When the viscosity of the second resin layer 35 is less than 100 Pa·s, the second resin layer 35 cannot protect the connection between the metal bumps 31 and the metal pads 14, and the metal bumps 31 may be broken. On the other hand, when the viscosity of the second resin layer 35 exceeds 30,000 Pa·s, the connection the metal bumps 31 and the metal pads 14 may be prevented.

Next, the wiring substrate 10 or the like is placed in an oven and heated to cure the second resin layer 35.

An elastic modulus of the cured second resin layer 35 after the reflow and the heating in the oven is 200 MPa to 15 GPa. When the elastic modulus of the second resin layer 35 is less than 200 MPa, the second resin layer 35 cannot sufficiently protect the connection between the metal bumps 31 and the metal pads 14, and the connection may be broken. On the other hand, when the elastic modulus of the second resin layer 35 exceeds 15 GPa, a stress is applied to the controller chip 30 and the wiring substrate 10, and warpage of the controller chip 30 and the wiring substrate 10 increases. The warpage makes it difficult to convey the controller chip 30 and the wiring substrate 10 in a subsequent assembly step.

Next, as shown in FIG. 1A, the spacers 50 are bonded to the wiring substrate 10 by the fourth resin layers 40. The plurality of memory chips 60 are bonded to the controller chip 30 and the spacers 50 by the fourth resin layers 40. Accordingly, a stacked body of the controller chip 30 and the plurality of memory chips 60 are formed on the wiring substrate 10. Next, wire bonding is performed using the bonding wire 80 as needed. Next, the structure including the controller chip 30, the plurality of memory chips 60, the second resin layer 35, and the like on the wiring substrate 10 is sealed with the third resin layer 90.

Thereafter, solder balls 15 are formed on the back surface of the wiring substrate 10. Further, the semiconductor device 1 is separated into individual pieces by dicing the wiring substrate 10. The semiconductor device 1 is manufactured in this manner.

According to the aforementioned embodiments, the first resin layer 20 bonds the controller chip 30 and the wiring substrate 10 in advance during the flip-chip connection, and thereafter the metal bumps 31 and the metal pads 14 are connected by reflow. Accordingly, breakage of the metal bump 31 due to the warpage of the controller chip 30 and the wiring substrate 10 is prevented. The warpage of the controller chip 30 and the wiring substrate 10 increases as a thickness of the controller chip 30 and a thickness of the wiring substrate 10 decrease. According to the embodiments, even when the thickness of the controller chip 30 is 100 μm or less and the thickness of the wiring substrate 10 is 200 μm or less, a bad connection between the metal bumps 31 and the metal pads 14 does not occur.

In the aforementioned embodiments, the crimping device 100 only needs to bond the first resin layer 20 of the controller chip 30 and the wiring substrate 10. Therefore, bonding time is short and throughput of the crimping device 100 is reduced.

When the first resin layer 20 bonds the controller chip 30 and the wiring substrate 10, the metal bumps 31 come into contact with the metal pads 14. Alternatively, a gap between the metal bumps 31 and the metal pads 14 is 1 μm or less. Therefore, when the second resin layer 35 is supplied, a filler contained in the second resin layer 35 does not enter between the metal bumps 31 and the metal pads 14. Therefore, connection reliability between the metal bumps 31 and the metal pads 14 is improved. For example, even when a pitch between the metal bumps 31 is reduced to 100 μm or less, the controller chip 30 and the wiring substrate 10 are fixed by the first resin layer 20 and the second resin layer 35. Therefore, the controller chip 30 is prevented from moving during the reflow of the metal bump 31. As a result, a poor connection between the metal bumps 31 and the metal bumps 14 is prevented.

Even when a low dielectric film is used on the controller chip 30, since the controller chip 30 and the wiring substrate 10 are fixed by the first resin layer 20 and the second resin layer 35, a stress can be prevented from concentrating on the low dielectric film in the vicinity of the metal bumps 31 during the reflow of the metal bumps 31. Accordingly, the low dielectric film can be prevented from being peeled off during the reflow of the metal bumps 31.

The viscosity of the second resin layer 35 during the reflow of the metal bumps 31 is 100 Pa·s to 30,000 Pa·s. Accordingly, the second resin layer 35 does not prevent a connection between the metal bumps 31 and the metal pads 14, and can protect the connection between the metal bumps 31 and the metal pads 14.

The elastic modulus of the cured second resin layer 35 after the reflow is 200 MPa to 15 GPa. Accordingly, a stress is not applied too much to the controller chip 30 and the wiring substrate 10, and the connection between the metal bumps 31 and the metal pads 14 can be sufficiently protected.

First Modification

Figure 10A:
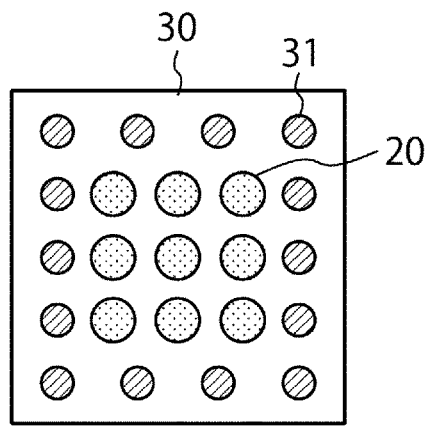
FIG. 10A and FIG. 10B are plan views showing a layout of a metal bump and the first resin layer on a second surface of the controller chip.
Figure 10B:
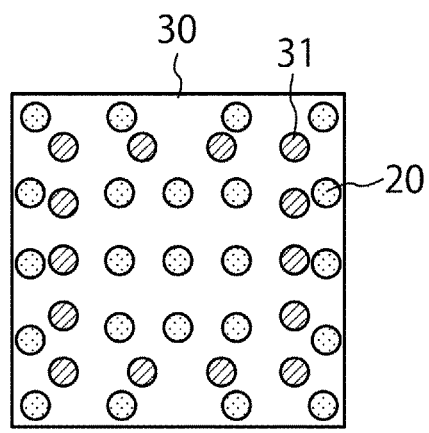

FIGS. 10A and 10B are plan views showing a layout of the metal bumps 31 and the first resin layers 20 on the second surface F2 of the controller chip 30. As shown in FIG. 10A, the first resin layers 20 are arranged two-dimensionally in a matrix and separated from the metal bumps inside a region surrounded by the metal bumps 31. A distance between the metal bumps 31 and the first resin layer 20 is, for example, in a range of 10 μm to 1 mm. When the distance between the metal bumps 31 and the first resin layer 20 is less than 10 μm, the first resin layer 20 may be distorted or deformed during exposure and development of the first resin layer 20. On the other hand, when the distance exceeds 1 mm, the warpage of the controller chip 30 may not be corrected, and the first resin layer 20 may be peeled off.

A bonding area of the first resin layer 20 is larger than a contact area between the metal bumps 31 and the metal pads 14. Accordingly, the connection between the metal bumps 31 and the metal pads 14 can be more strongly reinforced. In addition, the warpage of the controller chip 30 can be corrected.

As shown in FIG. 10B, the first resin layers 20 are provided in a substantially uniform manner inside and outside the region surrounded by the metal bumps 31. The first resin layers 20 are provided around the metal bumps 31 in this manner, so that the entire controller chip 30 can be bonded to the wiring substrate 10, and the warpage of the controller chip 30 can be further corrected.

Second Embodiment

Figure 11:
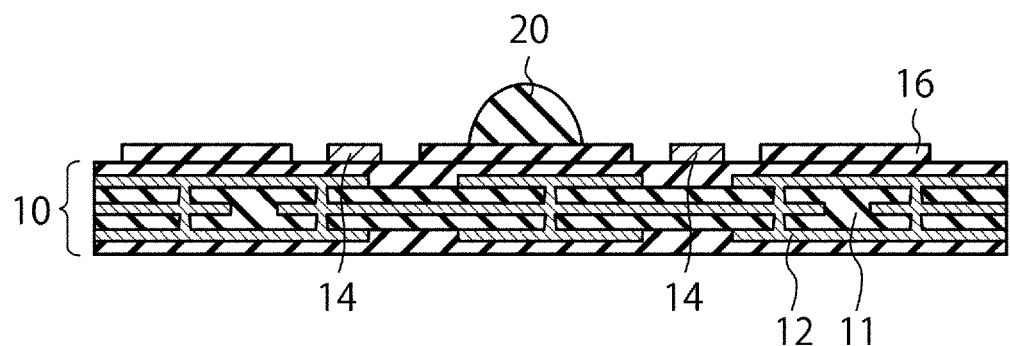
FIG. 11 is a cross-sectional view depicting aspects of a manufacturing method of a semiconductor device according to a second embodiment. a second embodiment.
Figure 12:
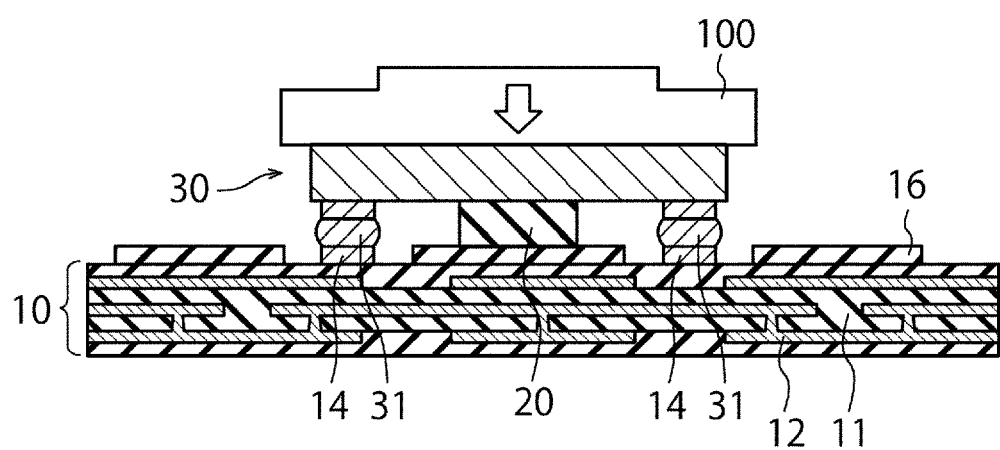
FIG. 12 is a cross-sectional view depicting aspects of a manufacturing method of a semiconductor device according to a second embodiment.

FIGS. 11 and 12 are cross-sectional views showing a manufacturing method of a semiconductor device according to a second embodiment. After steps shown in FIGS. 3A to 7C, the first resin layer 20 is coated onto the solder resist 16 between the metal pads 14 of the wiring substrate 10 as shown in FIG. 11. At this time, the first resin layer 20 is still in a liquid form or a paste form. A coating method for the first resin layer 20 may, in general, be any dispensing method (e.g., a jet method and a screw method), printing method, or the like. Here, in the second embodiment, the first resin layer 20 need not have photosensitivity (that is, be useable as a photoresist in a photolithographic process or the like).

Next, similar to the first embodiment, the controller chip 30 is flip-chip connected on the wiring substrate 10. Accordingly, as shown in FIG. 12, the first resin layer 20 connects the controller chip 30 and the wiring substrate 10. The first resin layer 20 is cured by a heat processing.

Thereafter, the semiconductor device 1 according to the second embodiment is manufactured by performance of the steps shown in FIG. 9 and FIG. 1. Characteristics of the first resin layer 20 and the second resin layer 35 are the same as those in the first embodiment.

In this manner, the first resin layer 20 may be selectively supplied to a predetermined position of the wiring substrate 10, and thereafter the controller chip 30 may be bonded onto the wiring substrate 10. At this time, the metal bump 31 of the controller chip 30 and the pad of the wiring substrate 10 are connected, and the first resin layer 20 is bonded to the controller chip 30.

In the second embodiment, the first resin layer 20 can be supplied in a liquid form or a paste form. Alternatively, the first resin layer 20 may be applied as a film-like (tape-like) resin. In such a case, in the step shown in FIG. 11, the film-like first resin layer 20 may be selectively attached to a predetermined position of the solder resist layer 16 between the metal pads 14 of the wiring substrate 10. That is, the first resin layer 20 may be selectively formed at a predetermined position of the wiring substrate 10, and thereafter the controller chip 30 may be bonded onto the wiring substrate 10.

Figure 13:
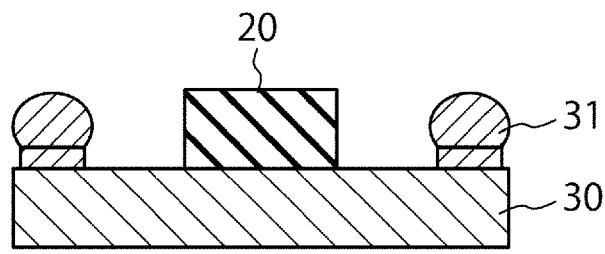
FIG. 13 is a cross-sectional view depicting aspects of a manufacturing method of a semiconductor device according to a third embodiment.

FIG. 13 is a cross-sectional view showing a manufacturing method of a semiconductor device according to a third embodiment. Here, the first resin layer 20 is attached to a controller chip 30 side. The controller chip 30 having the first resin layer 20 is connected onto the wiring substrate 10 by flip-chip connection.

For example, after the steps shown in FIGS. 3A to 7C, the first resin layer 20 is attached between the metal bumps of the controller chip 30 as shown in FIG. 13. The material of the first resin layer 20 may be the same as that of the first resin layer 20 in the aforementioned embodiments.

A film-like first resin layer 20 that can be cut into a predetermined size is attached to the controller chip 30. Alternatively, the film-like first resin layer 20 having a large size may be attached to the controller chip 30 while being punched with a die. Alternatively, a liquid or film-like photosensitive first resin layer 20 may be provided on the controller chip 30, and then formed into a desired pattern by a photolithography method.

Thereafter, the semiconductor device 1 according to the third embodiment is manufactured by steps shown in FIG. and FIG. 1. The same effects are obtained as the aforementioned embodiments.

Fourth Embodiment

FIG. 14 is a schematic diagram showing a manufacturing method of a semiconductor device 1 according to a fourth embodiment.

In the fourth embodiment, after the steps shown in FIGS. 3A to 8, the controller chip 30 and the wiring substrate 10 that are bonded to each other are subjected to a heat processing in a first reflow furnace 110 to remove moisture absorbed by the wiring substrate 10 or the like. This heat processin in the first reflow furnace 110 may be referred to as first heat processing step. A temperature of the first reflow furnace is less than or equal to the melting temperature of the metal bumps, but moisture can be removed. For example, the temperature of the first reflow furnace is 100° C. to 200° C. Next, in a resin coating device 120, the material for the second resin layer 35 is supplied from a syringe 121 to be between the controller chip 30 and the wiring substrate 10. Thereafter, in a second reflow furnace 135, the controller chip 30 and the wiring substrate 10 are subjected to another heat processing, the metal bumps 31 are melted and connected to a pad of the wiring substrate 10, and the second resin layer 35 is cured (hereinafter referred to as the second heat processing step). In this manner, a first reflow processing (the first heat processing step), a supply of the second resin layer 35, melting of the metal bumps 31 serving as a second reflow processing, and a curing processing of the second resin layer (the second heat processing step) may be performed by a series of devices connected to each other in a sealed manner or the like. Accordingly, the wiring substrate 10 can be prevented from absorbing moisture from the environmnet, thereby preventing voids from being generated in the second resin layer.

Other configurations and manufacturing steps can be the same as those in the aforementioned embodiments. Therefore, the same effect can be obtained.

Certain Modifications

In the embodiments described above, an elastic modulus of the third resin layer 90 is in a range of 5 GPa to 50 GPa and is larger than an elastic modulus of the second resin layer 35.

An elastic modulus of the fourth resin layers 40 is in a range of 100 MPa to 5 GPa and is larger than an elastic modulus of the first resin layer 20, but smaller than the elastic modulus of the second resin layer 35. That is, elastic moduli of the first resin layer 20, the second resin layer 35, the third resin layer 90, and the fourth resin layers 40 satisfy a relationship of: first resin layer 20<fourth resin layer 40<second resin layer 35<third resin layer 90.

Warpage of a substrate can be prevented/limited when such a relationship is satisified, and a connection can be protected.

In the embodiments described above, a thermal expansion coefficient of the second resin layer 35 is in a range of 15 ppm/° C. to 50 ppm/° C., and is larger than a thermal expansion coefficient of the third resin layer 90.

The thermal expansion coefficient of the third resin layer 90 is in a range of 5 ppm/° C. to 30 ppm/° C.

The thermal expansion coefficient of the fourth resin layers 40 is in a range of 50 ppm/° C. to 150 ppm/° C., and is larger than a thermal expansion coefficient of the first resin layer 20. That is, thermal expansion coefficients of the first resin layer 20, the second resin layer 35, the third resin layer 90, and the fourth resin layers 40 satisfy a relationship of: the third resin layer 90<the second resin layer 35<the first resin layer 20<the fourth resin layer 40. When such a relationship is satisfied, resins can be prevented from being peeled off, and connections can be protected.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a substrate having a plurality of pads on a surface of the substrate;
   a semiconductor chip that includes a plurality of metal bumps connected to corresponding pads on the substrate;
   a first resin layer between the surface of the substrate and the semiconductor chip;
   a second resin layer between the substrate and the semiconductor chip and between the first resin layer and at least one of the metal bumps; and
   a third resin layer on the substrate and above the semiconductor chip.

2. The semiconductor device according to claim 1, wherein the metal bumps are on a first surface of the semiconductor chip that faces the substrate.

3. The semiconductor device according to claim 1, wherein the pads are electrically connected to wires in the substrate.

4. The semiconductor device according to claim 1, wherein the first and second resin layers include fillers, and a concentration of filler in the second resin layer is greater than a concentration of filler in the first resin layer.

5. The semiconductor device according to claim 1, wherein a thermal expansion coefficient of the second resin layer is smaller than a thermal expansion coefficient of the first resin layer.

6. The semiconductor device according to claim 1, wherein an elastic modulus of the second resin layer is larger than an elastic modulus of the first resin layer.

7. The semiconductor device according to claim 1, wherein the second resin layer covers a part of a side surface of the semiconductor chip and a side surface of at least one of the metal bumps of the plurality of metal bumps.

8. The semiconductor device according to claim 7, further comprising:
a first insulating material on the substate, wherein
the second resin layer further covers a part of the first insulating material.

9. A manufacturing method of a semiconductor device, comprising:
forming a first resin layer on a semiconductor chip including a metal bump;
aligning the metal bump with a pad on a substrate, and then bonding the first resin layer to a surface of the substrate;
forming a second resin layer between the substrate and the semiconductor chip, the second resin layer including a reducing agent;
heating the substrate and the semiconductor chip such that the metal bump and the pad are connected to each other; and
curing the second resin layer and forming a third resin layer on the substrate and above the semiconductor chip.

10. The manufacturing method according to claim 9, wherein the first resin layer is photosensitive and patterned using a lithography technique.

11. The manufacturing method according to claim 9, further comprising:
heating the substrate and the semiconductor chip before forming the second resin layer.

12. The manufacturing method according to claim 11, wherein the heating before forming the second resin layer, the forming thereof, and the heating thereafter are performed in an uninterrupted series of steps and without exposing the substrate to ambient atmosphere.

13. The manufacturing method according to claim 9, wherein the heating includes connecting the metal bump and the pad by flip-chip connection.

14. A manufacturing method of a semiconductor device, comprising:
forming a first resin layer on a substrate, the substrate including a pad;
aligning a metal bump of a semiconductor chip with the pad, and bonding the first resin layer to the semiconductor chip;
forming a second resin layer between the substrate and the semiconductor chip, the second resin layer including a reducing agent;
heating the substrate and the semiconductor chip such that the metal bump and the pad are connected to each other; and
curing the second resin layer and forming a third resin layer on the substrate and above the semiconductor chip.

15. The manufacturing method according to claim 14, wherein the first resin layer is photosensitive and formed using a lithography technique.

16. The manufacturing method according to claim 14, further comprising:
heating the substrate and the semiconductor chip before forming the second resin layer.

17. The manufacturing method according to claim 16, wherein the heating before forming the second resin layer, the forming thereof, and the heating thereafter are performed in an uninterrupted series of steps and without exposing the substrate to ambient atmosphere.

18. The manufacturing method according to claim 14, wherein the heating includes connecting the metal bump and the pad by flip-chip connection.

* * * * *